United States Patent
Inoue

(10) Patent No.: US 7,307,300 B2
(45) Date of Patent: Dec. 11, 2007

(54) SOLID-STATE IMAGE PICK-UP DEVICE AND IMAGING SYSTEM USING THE SAME

(75) Inventor: Shunsuke Inoue, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 283 days.

(21) Appl. No.: 11/054,316

(22) Filed: Feb. 10, 2005

(65) Prior Publication Data

US 2005/0184322 A1 Aug. 25, 2005

(30) Foreign Application Priority Data

Feb. 19, 2004 (JP) .............................. 2004-042939

(51) Int. Cl.
*H01L 31/062* (2006.01)
*H01L 31/113* (2006.01)

(52) U.S. Cl. ....................... 257/291; 257/292

(58) Field of Classification Search ................ 257/222, 257/225, 233, 234, 239–241, 258, 291, 292
See application file for complete search history.

(56) References Cited

U.S. PATENT DOCUMENTS

| 6,498,622 | B1 | 12/2002 | Nakashiba | .................. | 348/308 |
| 2004/0188597 | A1 | 9/2004 | Inoue et al. | ................. | 250/214 |
| 2006/0214201 | A1* | 9/2006 | Rhodes | ...................... | 257/292 |

FOREIGN PATENT DOCUMENTS

| JP | 3-116840 | 5/1991 |
| JP | 2001-298177 | 10/2001 |
| JP | 2003-229556 A | 8/2003 |

* cited by examiner

*Primary Examiner*—Thien F Tran
(74) *Attorney, Agent, or Firm*—Fitzpatrick, Cella, Harper & Scinto

(57) ABSTRACT

The present invention provides a solid-state image pick-up device without shading in the dark state, and capable of making a dynamic range and a S/N high. Reference numeral 505 denotes an N-type cathode of a photodiode, 506 denoting a surface P-type region for forming the photodiode into an embedded structure, 508a denoting an N-type high concentration region which forms a floating diffusion and which is also a drain region of a transfer MOS transistor. Reference character 508b denotes a polysilicon lead-out electrode brought into direct contact with the N-type high concentration region. Light incident from the surface passes through an aperture without a metal third layer 525 to enter into the photodiode. Among incident lights, light reflected by the top surface of a gate electrode 504 of the transfer MOS transistor is reflected by a first layer metal 521 right above the polysilicon, so as to repeats reflection a plurality of times to attenuate sufficiently before entering into the floating diffusion section, thereby making the aliasing extremely small.

3 Claims, 9 Drawing Sheets

SOLID-STATE IMAGE PICK-UP DEVICE AND IMAGING SYSTEM USING THE SAME

BACKGROUND OF THE INVENTION

1. Field of the Invention

The present invention relates to a solid-state image pick-up device used for a digital camera, etc., as an image pick-up device for inputting a picture.

2. Related Background Art

In recent years, there has been a rapidly increasing demand on a solid-state image pick-up device used mainly for a digital still camera and a video camcorder, as an image pick-up device for inputting a picture.

As such solid-state image pick-up device, CCD (Charge Coupled Device) and MOS type sensors are used. Although the former, which has a high sensitivity and a low noise level in comparison with the latter, has been widely used as an image pick-up device of high picture quality, the former has disadvantages such as a large power consumption, a high drive voltage, a high cost due to the fact that the ordinary semiconductor manufacturing process cannot be applied, and a difficulty in integrating peripheral circuits such as a drive circuit, as a result of which the MOS type solid-state image pick-up device, which is capable of preventing the above described disadvantages, is expected to be employed in the application for portable devices for which new demands are expected.

The CMOS solid-state image pick-up device, which is formed by the CMOS process, has been put in practical use as a representative of the MOS type solid-state image pick-up devices. A pixel circuit of the CMOS solid-state image pick-up device is shown in FIG. 1, a plane layout of the pixel is shown in FIG. 2, and a cross-sectional structure of the pixel is shown in FIG. 3.

In FIG. 1, reference numeral 1 denotes a photodiode, 2 denoting a transfer MOS transistor for transferring a charge of the photodiode, 3 denoting a floating diffusion for temporarily storing the transferred charge, 4 denoting a reset MOS transistor for resetting the floating diffusion and the photodiode, 5 denoting a selection MOS transistor for selecting an arbitrary one line in an array, 6 denoting a source follower MOS transistor for converting the charge of the floating diffusion into a voltage and for amplifying the voltage by a source follower amplifier, 7 denoting a read line, which is common to a column, for reading out pixel voltage signals, and 8 denoting a constant current source for making a constant current flow in the read line.

A brief description of the operation of the circuit will be provided below. Incident light is converted into an electric charge by the photodiode 1, and the charge is stored in the floating diffusion 3 by the transfer MOS transistor 2. Since the floating diffusion 3 and the photodiode 1 are reset to a constant potential by turning off the reset MOS transistor 4 and the transfer MOS transistor 2 beforehand, the potential of the floating diffusion 3 is changed in accordance with the charge generated by the incident light. The potential of the floating diffusion 3 is amplified by the source follower MOS transistor 6 and is outputted to the read line 7. The pixel is chosen by turning off the selection MOS transistor 5. An output circuit (not shown) performs a differential operation between the reset potential of the floating diffusion 3 and the potential after the light signal is stored, so as to detect the light signal component.

FIG. 2 shows an example of a layout of the pixel circuit shown in FIG. 1. Reference numeral 10 denotes an active area in which a photodiode is formed, and 11 denotes an active area in which a selection MOS transistor and a source follower transistor are formed. Reference numeral 20 denotes an area of a transfer MOS transistor, and 21 denotes a gate line of the transfer MOS transistor. An area 30 surrounded by a broken line indicates a portion formed of a PN junction of semiconductor in a floating diffusion. Reference numeral 31 also denotes a contact for leading out an electrode from the floating diffusion, 32 denoting a metallic electrode for leading out the floating diffusion, 33 denoting a contact for connecting the metallic electrode 32 to a polysilicon, and 34 denoting a polysilicon electrode. Reference numeral 40 denotes a reset MOS transistor area and 41 denoting a contact for connection with a reset power supply. Reference numeral 50 denotes a gate area of the selection MOS transistor, 51 denoting a contact for connecting with a VDD power supply, 60 denoting an area of a source follower MOS transistor, of which gate electrode is formed by the polysilicon 34 electrically connected with the floating diffusion. Reference numeral 70 denotes an output line configured by a metal electrode. Reference numeral 71 denotes a contact for connecting the output line 70 with the main electrode of the source follower MOS transistor 60.

FIG. 3 is a cross sectional view taken along the line 3-3 in the layout shown in FIG. 2. Reference numeral 301 denotes an n-type silicon substrate, 302a denoting a P-type well and 302b denoting a P-type embedded layer, 303a denoting a gate oxide film of the MOS transistor, 303b denoting a thin oxide film on the light receiving section, 304 denoting a gate electrode of the transfer MOS transistor, 305 denoting an N-type cathode of the photodiode 1, 306 denoting a surface P-type region for forming the photodiode into an embedded structure, 307a denoting an LOCOS oxide film for element isolation, 307b denoting a P-type channel stop layer, 308 denoting a N-type high concentration region which forms the floating diffusion 3 and which is also the drain region of the transfer MOS transistor 2, 309 denoting a silicon oxide film for insulating the gate electrode from a metal first layer, 320 denoting a contact plug, 321 denoting the metal first layer, 322 denoting an interlayer insulating film for insulating the metal first layer from a metal second layer, 323 denoting the metal second layer, 324 denoting an interlayer insulating film for insulating the metal second layer from a metal third layer, 325 denoting the metal third layer and 326 denoting a passivation film. In addition, in a color photoelectric converter, a color filter layer (not shown) and further a micro lens for improving the sensitivity are formed on the upper layer of the passivation film 326.

Light incident from the surface passes through an aperture without the metal third layer to enter into the photodiode. The light is absorbed in the N-type anode 305 of the photodiode or in the P-type well 302a to generate electron-hole pairs. Among the electron-hole pairs, electrons are stored in the N-type anode region.

However, the above described conventional CMOS solid-state image pick-up device has a disadvantage that signal electrons generated by the incident light is mixed into the floating diffusion 3 to cause the output voltage to fluctuate. As shown in FIG. 3, among electron-hole pairs 330b generated below the gate of the transfer MOS transistor by an obliquely incident light beam 330a, the electrons are attracted from the N-type cathode 305 of the photodiode to the N type high concentration layer 308 constituting the floating diffusion. Moreover, light 331a incident on the gate electrode 304 of the transfer MOS transistor, for example, is repeatedly reflected as shown in FIG. 3 to generate electron-hole pairs 331b immediately below the N type high concentration layer 308. Among the electron-hole pairs, the electrons are attracted to the N type high concentration layer.

When the first layer metal 320 in FIG. 3 is extended to the aperture side to improve the shading characteristic, the electrostatic capacity of the floating diffusion section is increased so as to reduce the charge conversion coefficient, resulting in a problem of degrading an S/N.

As described above, the electrons directly captured in the floating diffusion without passing through the photodiode generate aliasing to cause problems in a solid-state image pick-up device, such as increasing noise, reducing a dynamic range, increasing output and shading in the dark state. For this reason, improving the shading characteristic of the floating diffusion has been a problem to be solved in the conventional CMOS solid-state image pick-up device.

In the CCD type solid state image pick-up device, a source follower amplifier, in which the floating diffusion is used at the last stage of the readout circuit, is also generally used. For example, an example is disclosed in Japanese Patent Application Laid-Open No. H03-116840, in which leading-out of electrodes for the source follower amplifier is effected with a polysilicon. In this example, however, improvement in the shading characteristic is not described, and also the fact that electrons generated in the silicon flow into the floating diffusion, as described in the above example of the prior art, is not taken into account. Moreover, in the CCD-type solid-state image pick-up device, since only one floating diffusion amplifier is provided on the post-stage of a horizontal CCD and is located apart from the pixel section, the layout can be performed without being limited by the pixel area, and hence a special device is not needed.

On the other hand, in the CMOS solid-state image pick-up device, there are conditions that the photodiode is arranged close to the floating diffusion because the floating diffusion is present in each pixel, and that a slight gap must be inevitably provided for the metallic electrodes serving as the light shield because the metallic electrodes are also used as wiring of the circuit, etc., the conditions being different from those in the CCD-type solid-state image pick-up device, as a result of which a new structural design is needed.

SUMMARY OF THE INVENTION

Accordingly, it is an object of the present invention to provide a solid-state image pick-up device without shading in the dark state and capable of enhancing a dynamic range and an S/N, by improving the shading characteristic of the floating diffusion.

In order to solve the above described problem, a first aspect of the present invention is, in a solid-state image pick-up device in which a plurality of pixels, each provided with a photoelectric conversion section and a signal amplifying section are arranged in an array form, and in which a floating diffusion arranged for each of the pixels or each of a plurality of the pixels serves as an input of the signal amplifying section, characterized in that at least a part of connection from the floating diffusion to the signal amplifying section is effected by using direct contact of the floating diffusion with a polysilicon, and in that the floating diffusion is shaded by a metal layer which is not electrically connected with the floating diffusion.

Further, a second aspect of the present invention is, in a solid-state image pick-up device in which a plurality of pixels, each provided with a photoelectric conversion section and a signal amplifying section, are arranged in an array form, and in which a floating diffusion arranged for each of the pixels or each of a plurality of the pixels serves as an input of the signal amplifying section, characterized in that at least a part of connection from the floating diffusion to the signal amplifying section is effected by using direct contact of the floating diffusion with a polysilicon, and in that a potential barrier is provided between the photoelectric conversion section and the floating diffusion.

Further, a third aspect of the present invention is, in the solid-state image pick-up device according to the first and second aspects, characterized in that the connection from the floating diffusion to the input of the signal amplifying section is effected only with the polysilicon.

Further, a fourth aspect of the present invention is characterized in that a metal layer for shading the floating diffusion is a metal layer closest to the floating diffusion.

Further, a fifth aspect of the present invention is, in the solid-state image pick-up device according to the fourth aspect, characterized in that the metal layer closest to the floating diffusion is provided with a reflectivity lower than that of other layers of the metal layer.

Further, a sixth aspect of the present invention is, in the solid-state image pick-up device according to the fourth aspect, characterized in that the polysilicon is configured by a plurality of layers, of which uppermost layer has a transmissivity in the region of visible light lower than that of the other layers of polysilicon.

Further, a seventh aspect of the present invention is, in the solid-state image pick-up device according to the present invention, characterized in that a potential barrier, for preventing the signal charges generated in the photoelectric conversion section from flowing into the floating diffusion, is provided between the photoelectric conversion section and the floating diffusion.

Further, a eighth aspect of the present invention is, in the solid-state image pick-up device according to the present invention, characterized in that resetting means and charge transfer means are provided for each pixel, and in that the transfer of the signal charges stored in the photoelectric conversion section to the floating diffusion is simultaneously performed in all pixels after all pixels are reset at the same time, for making the potential or the floating diffusion successively read out.

Further, according to a ninth aspect of the present invention, there is provided an image pick-up system comprising: the solid-state image pick-up device according to the present invention; an image forming optical system for forming light from a subject into an image; and a signal processing circuit for performing digital conversion and processing of output signals from the solid-state image pick-up device.

According to an effect of the first aspect of the present invention, in the solid-state image pick-up device in which a plurality of pixels, each provided with a photoelectric conversion section and a signal amplifying section, are arranged in an array form, and in which a floating diffusion arranged for each of the pixels or each of a plurality of the pixels serves as an input of the signal amplifying section, since at least a part of connection from the floating diffusion to the signal amplifying section is effected by using direct contact of the floating diffusion with a polysilicon and the floating diffusion is shaded by a metal layer which is not electrically connected with the floating diffusion, the quantity of light directly incident on the floating diffusion can be reduced and the parasitic capacitance of the floating diffusion section which is generated between the metal layer and the other conductive layers is not increased, thereby enabling a high S/N to be maintained.

According to an effect of the second aspect of the present invention, in a solid-state image pick-up device in which a plurality of pixels, each provided with a photoelectric conversion section and a signal amplifying section, are arranged in an array form, and in which a floating diffusion arranged for each of the pixels or each of a plurality of the pixels serves as an input of the signal amplifying section, since at least a part of connection from the floating diffusion to the signal amplifying section is effected by using direct contact of the floating diffusion with a polysilicon and a potential barrier is provided between the photoelectric conversion section and the floating diffusion, the quantity of light directly incident on the floating diffusion can be reduced by shading the floating diffusion with the first layer metal, and the diffusion of signal charges generated in the silicon into the floating diffusion can be suppressed.

According to an effect of the third aspect of the present invention, since the connection from the floating diffusion to the input of the signal amplifying section is effected only with the polysilicon, shading can be effected without providing a gap in the first layer metal and also a space for connecting from the polysilicon to the first layer metal can be eliminated so as to enable the floating diffusion to be made small.

According to an effect of the fourth aspect of the present invention, since the metal layer for shading the floating diffusion is a metal layer closest to the floating diffusion, the amount of light incident from above the floating diffusion can be minimized.

According to an effect of the fifth aspect of the present invention, since the lower most metal layer is configured by a plurality of layers and is provided with a reflectivity lower than that of other layers of the metal layer, the quantity of light incident on the floating diffusion due to the light reflected on the base surface of the metal layer can be reduced.

According to an effect of the sixth aspect of the present invention, in the fourth aspect of the invention, the polysilicon is configured by a plurality of layers, of which uppermost layer has a transmissivity in the visible light area lower than that of the other layers of polysilicon, so that the quantity of light which is incident on the floating diffusion by repeating reflections after reflected on the surface of the polysilicon, can be reduced.

According to an effect of the seventh aspect of the present invention, in the first aspect of the present invention, since a potential barrier for preventing the signal charges generated in the photoelectric conversion section from flowing into the floating diffusion, is provided between the photoelectric conversion section and the floating diffusion, the diffusion of the signal charges generated in the silicon into the floating diffusion can be suppressed.

According to an effect of the eighth aspect of the present invention, in the first and second aspects of the invention, since resetting means and charge transfer means are provided for each pixel, and the transfer of signal charges stored in the photoelectric conversion section to the floating diffusion is simultaneously performed in all pixels after all pixels are reset at the same time, and then the potential of the floating diffusion is made to be successively read out so as to enable an electronic shutter of whole picture simultaneous storage type to operate, an operation of the electronic shutter for enabling a solid-state image pick-up device to perform imaging of high picture quality can be realized without a complicated pixel circuit.

According to the present invention, the shading characteristic of the floating diffusion of the solid-state image pick-up device can be improved. As a result, the dynamic range and S/N can be raised without causing shading in the dark state. Further, with the use of the present invention, in the solid-state image pick-up device, the electronic shutter of all pixels simultaneous storage type with high picture quality can be realized.

DESCRIPTION OF THE PREFERRED EMBODIMENTS

Next, the best mode for carrying out the present invention is explained with reference to the drawings.

First Embodiment

Figure 4:
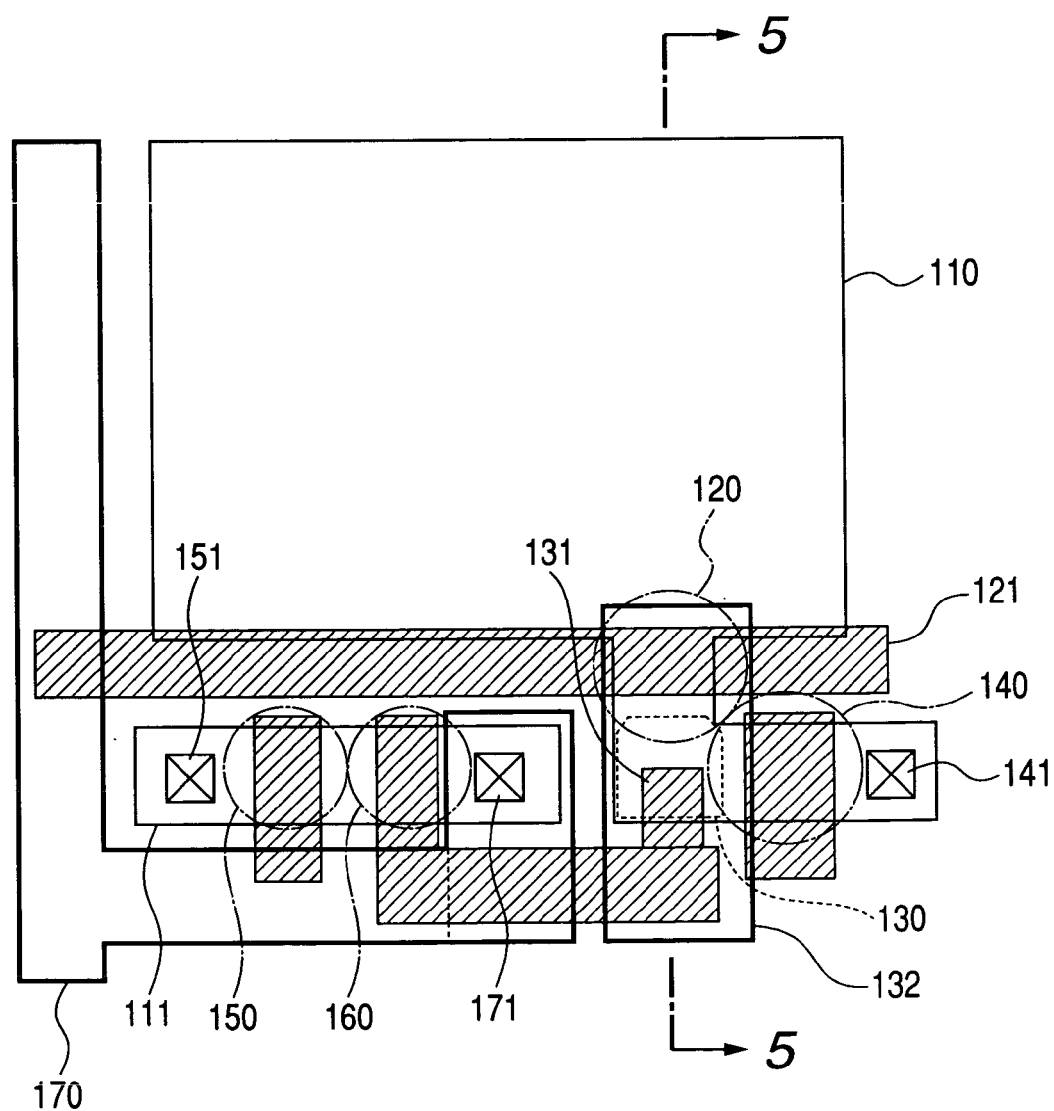
FIG. 4 is an example of a pixel layout of a CMOS solid-state image pick-up device of a first embodiment according to the present invention.

FIG. 4 shows a layout of a pixel circuit for explaining a first embodiment according to the present invention. Reference numeral 110 denotes an active area in which a photodiode is formed, and 111 denotes an active area in which a selection MOS transistor and a source follower transistor are formed. Reference numeral 120 denotes an area of a transfer MOS transistor and 121 denotes a gate line of the transfer MOS transistor. An area 130 surrounded by a broken line shows a portion formed of a PN junction of semiconductor in the floating diffusion.

Figure 1:
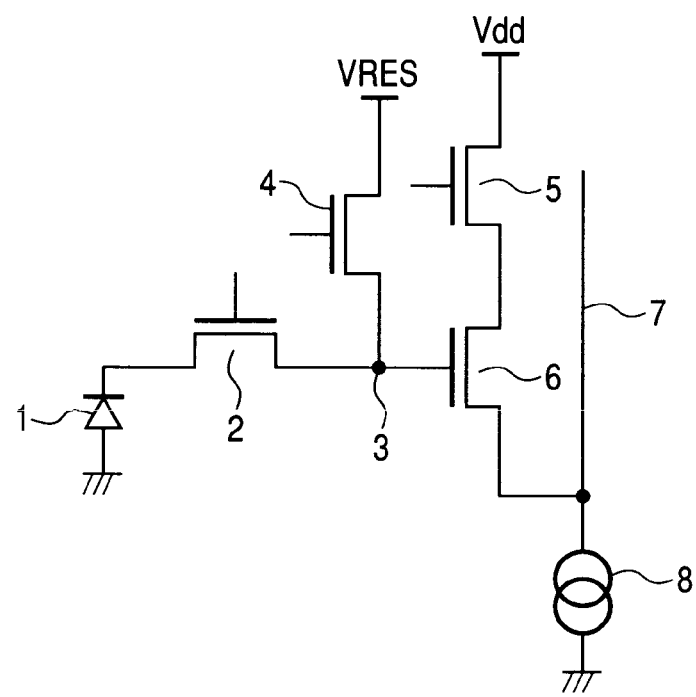
FIG. 1 shows a pixel circuit of a conventional CMOS solid-state image pick-up device.
Figure 2:
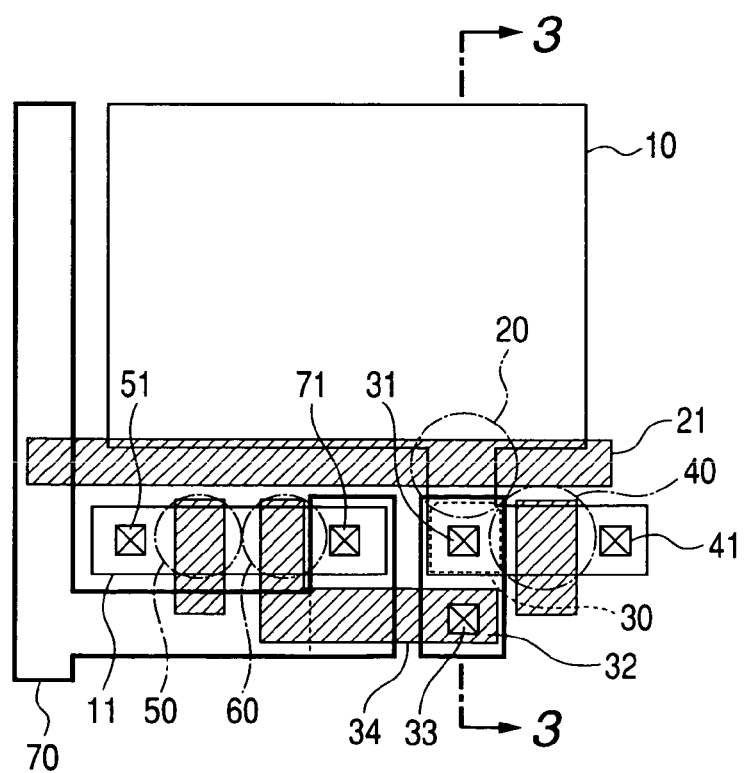
FIG. 2 is an example of a pixel layout of the conventional CMOS solid-state image pick-up device.
Figure 3:
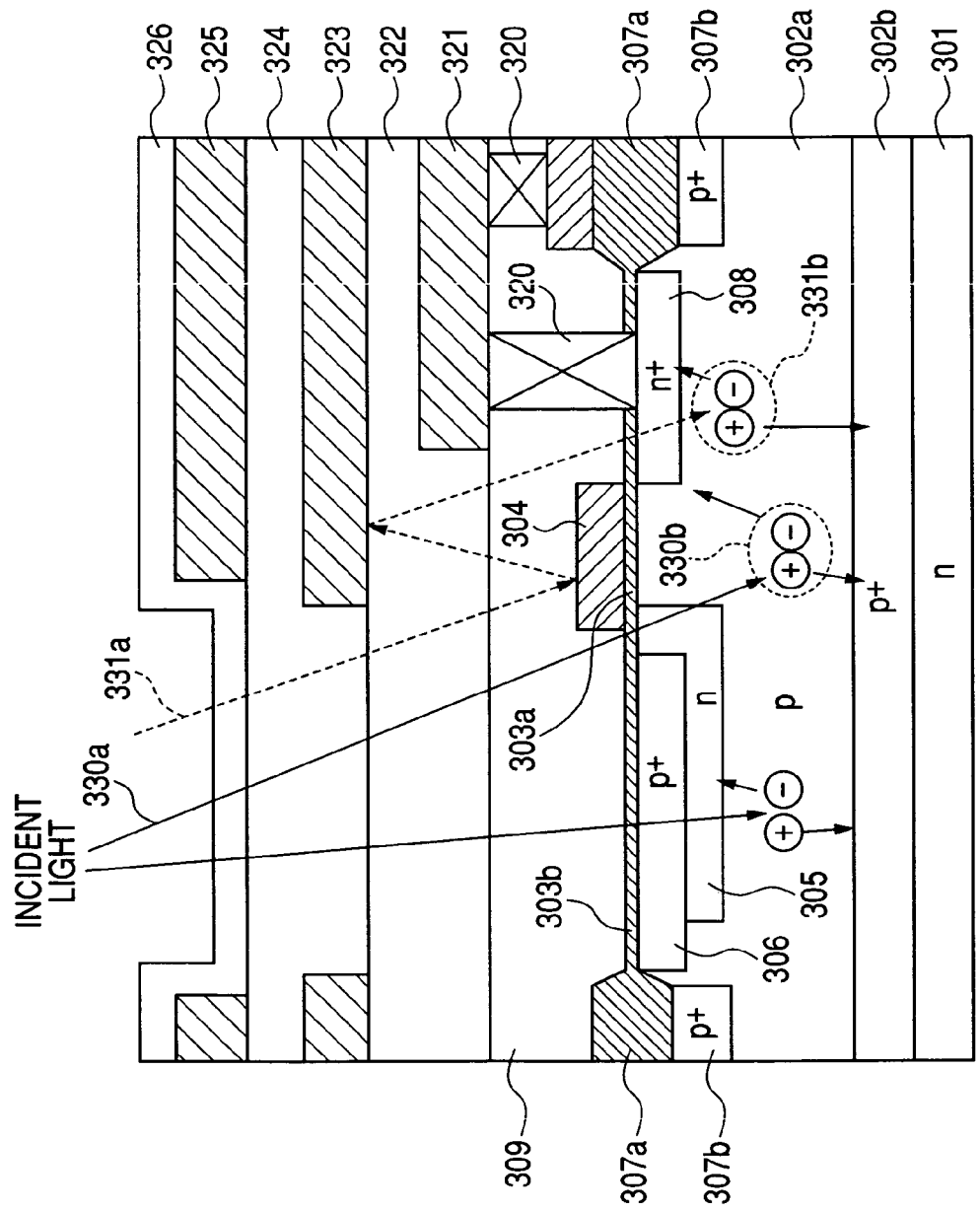
FIG. 3 is a sectional view of a pixel of the conventional CMOS solid-state image pick-up device.

A difference from the prior art form is that leading-out of an electrode from the floating diffusion is effected by a direct contact with a polysilicon 131. The polysilicon 131 serves directly as a gate electrode of a source follower MOS transistor with no intermediary of a metallic electrode. Reference numeral 132 denotes a shading metal covering over the floating diffusion, which shading metal in the present embodiment covers in oversize over the gate electrode of the transfer transistor section 120 and the P-N junction section 130 of the floating diffusion. In this way, it is possible to shade the floating diffusion in a position close to the silicon by leading out the floating diffusion with the polysilicon. The floating diffusion may be made to be in an electrically floating state, or to have a fixed potential by connecting it with a second layer metal or a third layer metal. The other parts are the same as those in FIG. 2, and reference numeral 140 denotes a reset MOS transistor area, 141 denoting a contact for connecting with a reset power supply, 150 denoting a gate area of the selection MOS transistor, 151 denoting a contact for connecting with a VDD power supply, 106 denoting the source follower MOS transistor area, of which gate electrode is formed by the polysilicon 131 electrically connected with the floating diffusion. Reference numeral 170 denotes an output line formed by a metallic electrode. Reference numeral 171 also denotes a contact for connecting the output line 170 with the main electrode of the source follower MOS transistor 160.

Figure 5:
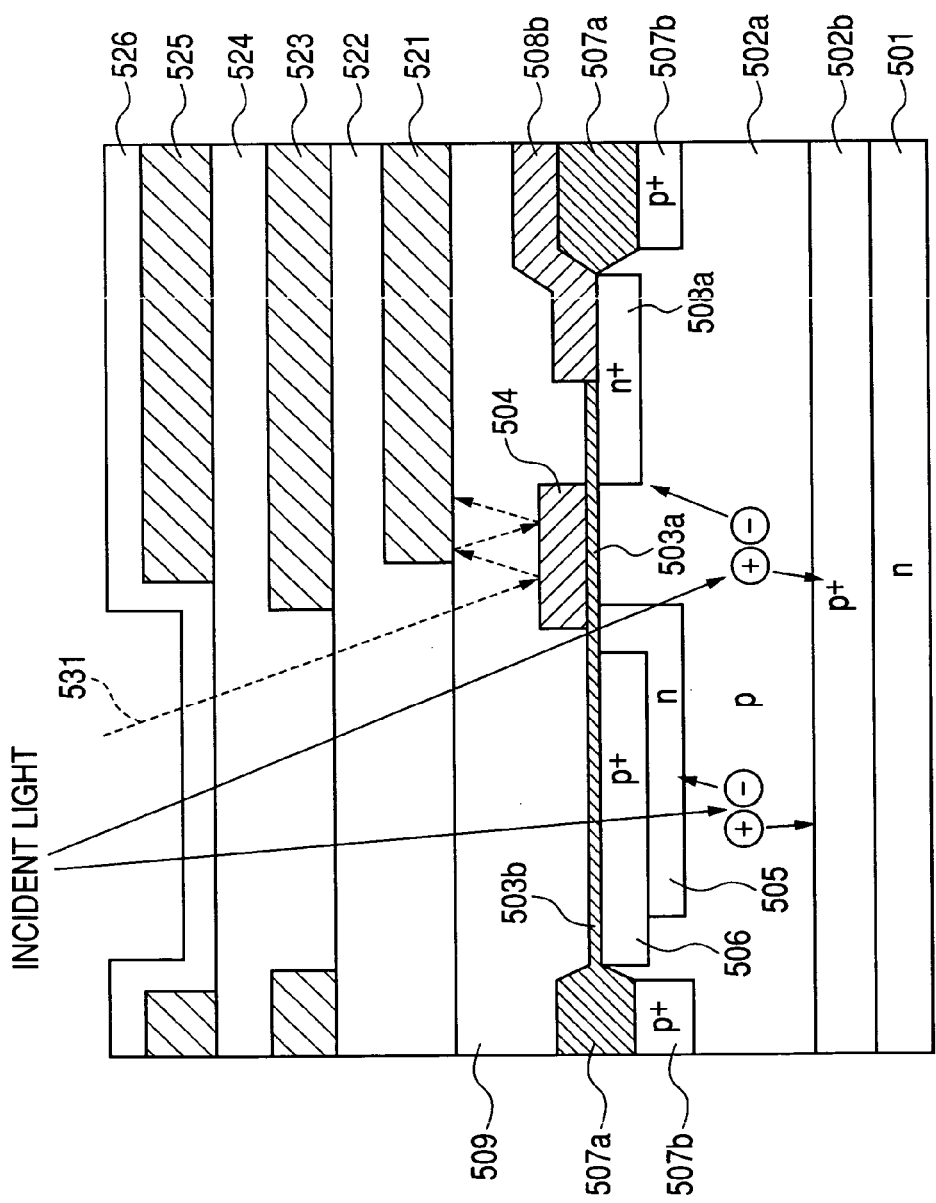
FIG. 5 is a sectional view of the CMOS solid-state image pick-up device of the first embodiment according to the present invention.

FIG. 5 is a cross sectional view taken along the line 5-5 in FIG. 4. Reference numeral 501 denotes an n-type silicon substrate, 502a denoting a P-type well, 502b denoting a P-type embedded layer, 503a denoting a gate oxide film of a MOS transistor, 503b denoting a thin oxide film on a light receiving section, 504 denoting a gate electrode of a transfer MOS transistor, 505 denoting an N-type cathode of the photodiode 1, 506 denoting a surface P-type region for forming the photodiode into an embedded structure, 507a denoting a LOCOS oxide film for element isolation, 507b denoting a P-type channel stop layer, 508a denoting an N-type high concentration region which forms the floating diffusion and which is also a drain region of the transfer MOS transistor. Reference character 508b denotes a polysilicon lead-out electrode brought into direct contact with the N-type high concentration region. Reference numeral 509 denotes a silicon oxide film for insulating the gate electrode from a metal first layer, and 521 denotes the metal first layer for shading the floating diffusion section. Reference numeral 522 denotes an interlayer insulating film for insulating the metal first layer from a metal second layer, 523 denoting the metal second layer, 524 denoting an interlayer insulating film for insulating the metal second layer from a metal third layer, 525 denoting the metal third layer, and 526 denoting a passivation film. In a color photoelectric converter, a color filter layer (not shown) and also a micro lens for improving the sensibility are further formed on the upper layer of the passivation film 526, as in the prior art.

Light incident from the surface passes through an aperture without the metal third layer to enter into the photodiode. Among the incident lights, a light reflected by the top surface of the gate electrode 504 of the transfer MOS transistor is reflected by the first layer metal right above the polysilicon, as shown in FIG. 5, so as to repeat a plurality of reflections to attenuate sufficiently before entering into the floating diffusion section, thereby making the aliasing extremely small. In addition, the floating diffusion, which is covered with a metal without a gap as shown in FIG. 4, has a high light shielding performance for light traveling a path other than that shown in the cross sectional view in FIG. 5.

The first layer metal is usually formed of aluminum or of an alloy mainly made of aluminum, but in order to make the effects of the present invention remarkable, the lowermost layer of the first layer metal is preferably formed of TiN so as to lower the reflectance to the stray light. TiN also serves as a barrier metal, and hence is a material suitable for forming minute electric wirings.

According to the present embodiment, the shading characteristic of the floating diffusion can be improved, and the effect of the aliasing can be eliminated.

Figure 8:
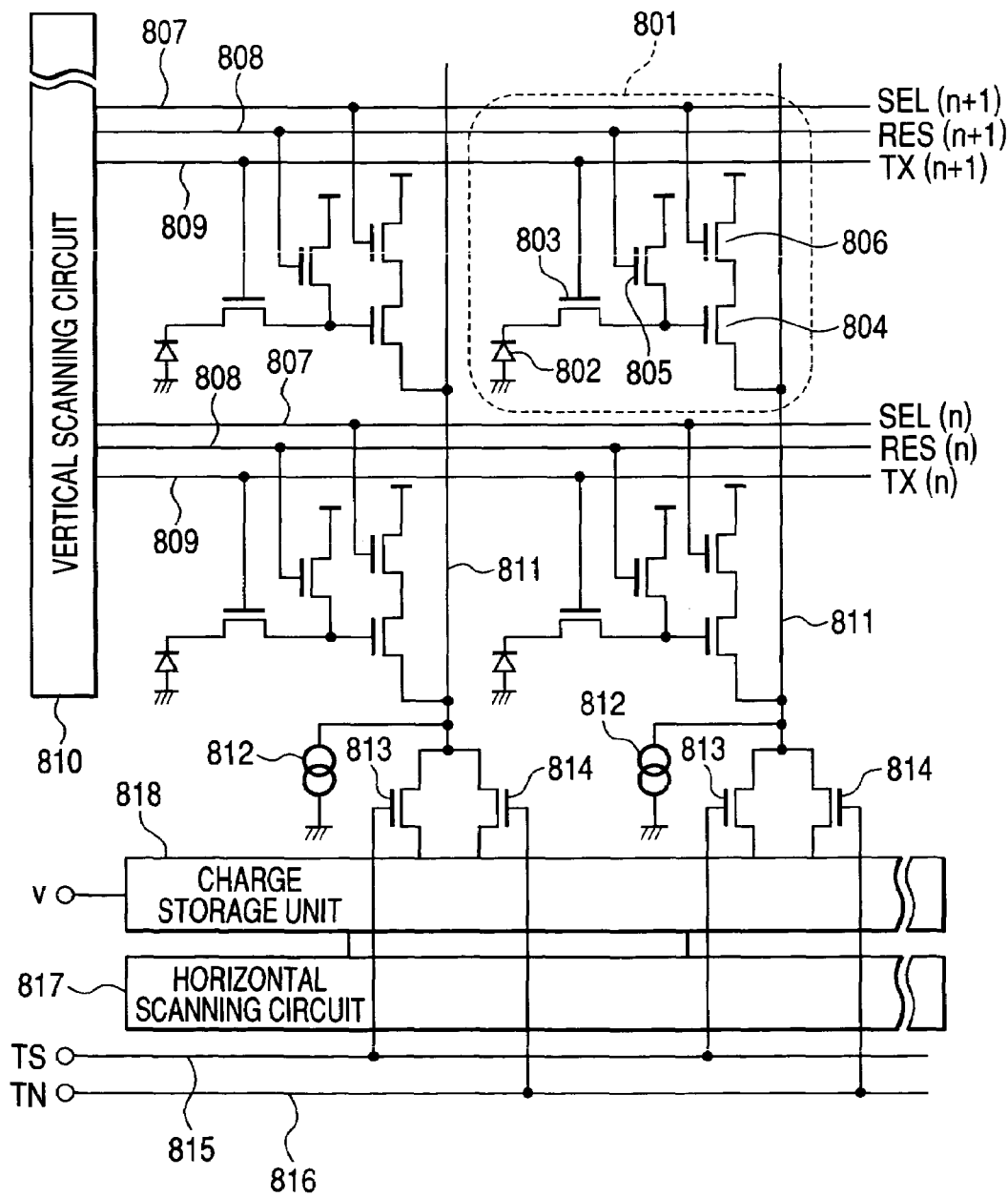
FIG. 8 is a circuit constitution figure of a CMOS solid-state image pick-up device according to the present invention.

FIG. 8 is the schematic representation of a circuit configuration in which a number of pixel circuits according to the present invention are two-dimensionally arranged. A pixel 801 includes a photodiode 802, a transfer MOS transistor 803, a source follower MOS transistor 804, a reset MOS transistor 805, and a selection MOS transistor 806. Gates of the selection MOS transistors in the same row are connected to a selection line 807, gates of the reset MOS transistors in the same row are connected to a reset line 808 and gates of the transfer MOS transistors in the same row are connected to a transfer line 809, respectively, each of the gates in the same row being scanned and selected by a vertical scanning circuit 801. A current source 812 is connected to an output line 811 in the same column, and the potential of the output line can be read out by the source follower operation. Light signals are stored in a charge storage section 818 by a light signal transfer MOS transistor 813 selected by a light signal read line 815, and noise signals are stored in the charge storage section 818 by a noise signal transfer MOS transistor 814 selected by a noise signal read line 816, respectively. The signals stored in the charge storage section 818 are sequentially scanned and read out by the horizontal scanning circuit, and the difference between the light signal and the noise signal is outputted by a differential amplifier circuit (not shown).

Figure 9:
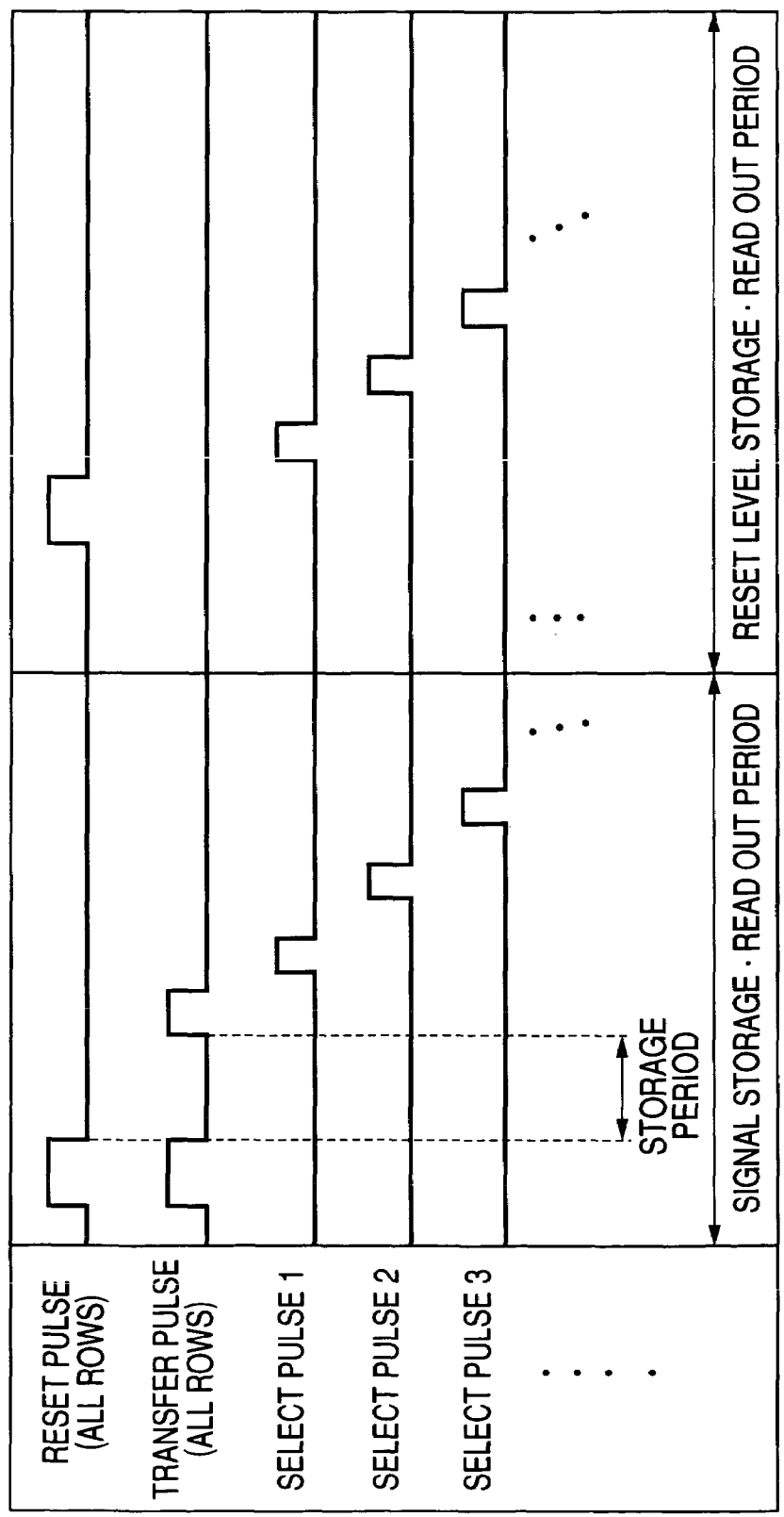
FIG. 9 is a timing chart of the operation of an electronic shutter of all pixels simultaneous storage type using the CMOS solid-state image pick-up device according to the present invention.

According to the present invention, a significant effect can be obtained in the case where an electronic shutter of all pixel simultaneous storage type is operated with a CMOS solid-state image pick-up device. FIG. 9 shows a timing chart of the operation of the electronic shutter. First, in order to reset the photodiode of all pixels, the reset pulse for all rows is put ON and the transfer pulse for all rows is put ON. From the moment that both pulses are put OFF, photodiodes over the entire screen start the storing operation at the same time. After the storing operation is performed for a desired period and then the transfer pulse for all rows is put ON, the signal charge of each pixel is transferred to the floating diffusion of each pixel simultaneously by putting the transfer pulse for all rows OFF. Next, by putting the selection pulse ON/OFF for each row, the charge of the floating diffusion is sequentially read out for each row. The read-out signals are stored as "S+N" signals in the charge storage section 818 in FIG. 8.

Next, by putting the reset pulse for all rows ON, the floating diffusion of all pixels is reset at the same time. After putting the reset pulse OFF, the potential of the floating diffusion of each row is sequentially read out. The read-out signals are stored as "N" signals in a capacitance section provided adjacent to the "S+N" in the charge storage section 818. "S" signal is taken out by inputting the stored "S+N" and "N" signals to the differential amplifier.

Since in this operation a time period during which the charge is stored in the floating diffusion is different for each row, in the conventional structure, a row having a long storage period (in this case, the last line) has an output potential shaded by the aliasing entering into the floating diffusion, as compared with a row with a short storage period (in this case, the first line). Since the present invention makes it possible to suppress the aliasing entering into the floating diffusion, such shading is not caused or made to be a level causing no problem.

Figure 10:
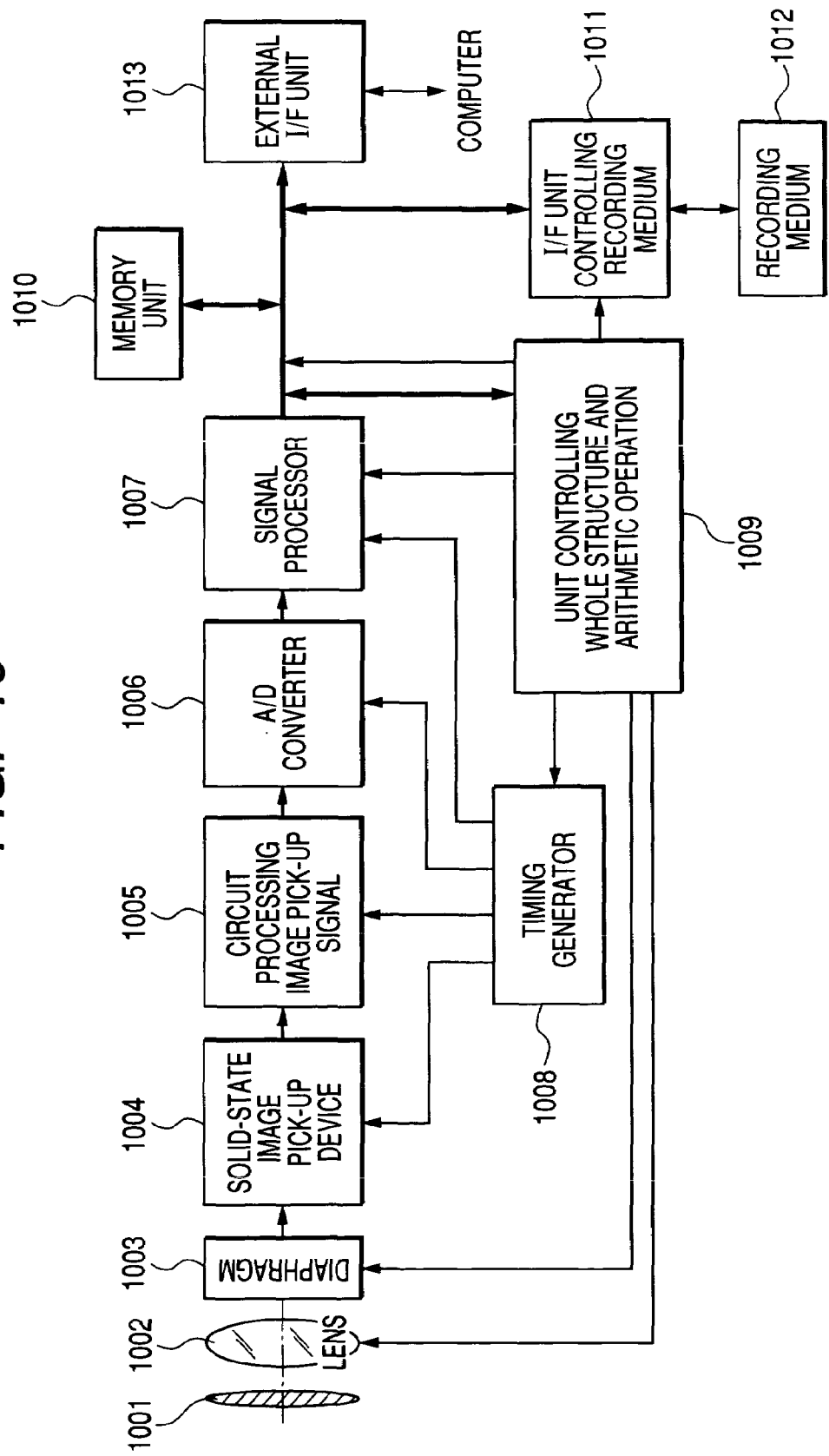
FIG. 10 is a block diagram showing a configuration of a camera system using the CMOS solid-state image pick-up device according to the present invention.

FIG. 10 shows an example of a circuit block in the case where a solid-state image pick-up device according to the present invention is applied to a camera. A shutter 1001 is provided in the front side of a lens 1002 so as to control exposure. Light quantity is controlled by a diaphragm 1003 as required, and an image is formed on a solid-state image pick-up device 1004. A signal outputted from the solid-state image pick-up device 1004 is processed by a circuit processing image pick-up signal 1005, and is converted from an analog signal into a digital signal by an A/D converter 1006. The output signal is further subjected to arithmetic processing by a signal processor 1007. The processed digital signal is stored in a memory unit 1010, and is sent to an external device through an external I/F unit 1013. The solid-state image pick-up device 1004, the circuit processing image pick-up signal 1005, the A/D converter 1006, and the signal processor 1007 are controlled by a timing generator 1008, and also the whole system is controlled by a unit controlling whole structure and arithmetic operation 1009. In order to record a picture in a recording medium 1012, an output digital signal is recorded through an I/F unit controlling recording medium 1011 controlled by the unit controlling whole structure and arithmetic operation.

In addition, it goes without saying that the present invention can be applied to the case where a hole storage type pixel is configured by inverting all other conductivity types in the present embodiment.

Second Embodiment

Figure 6:
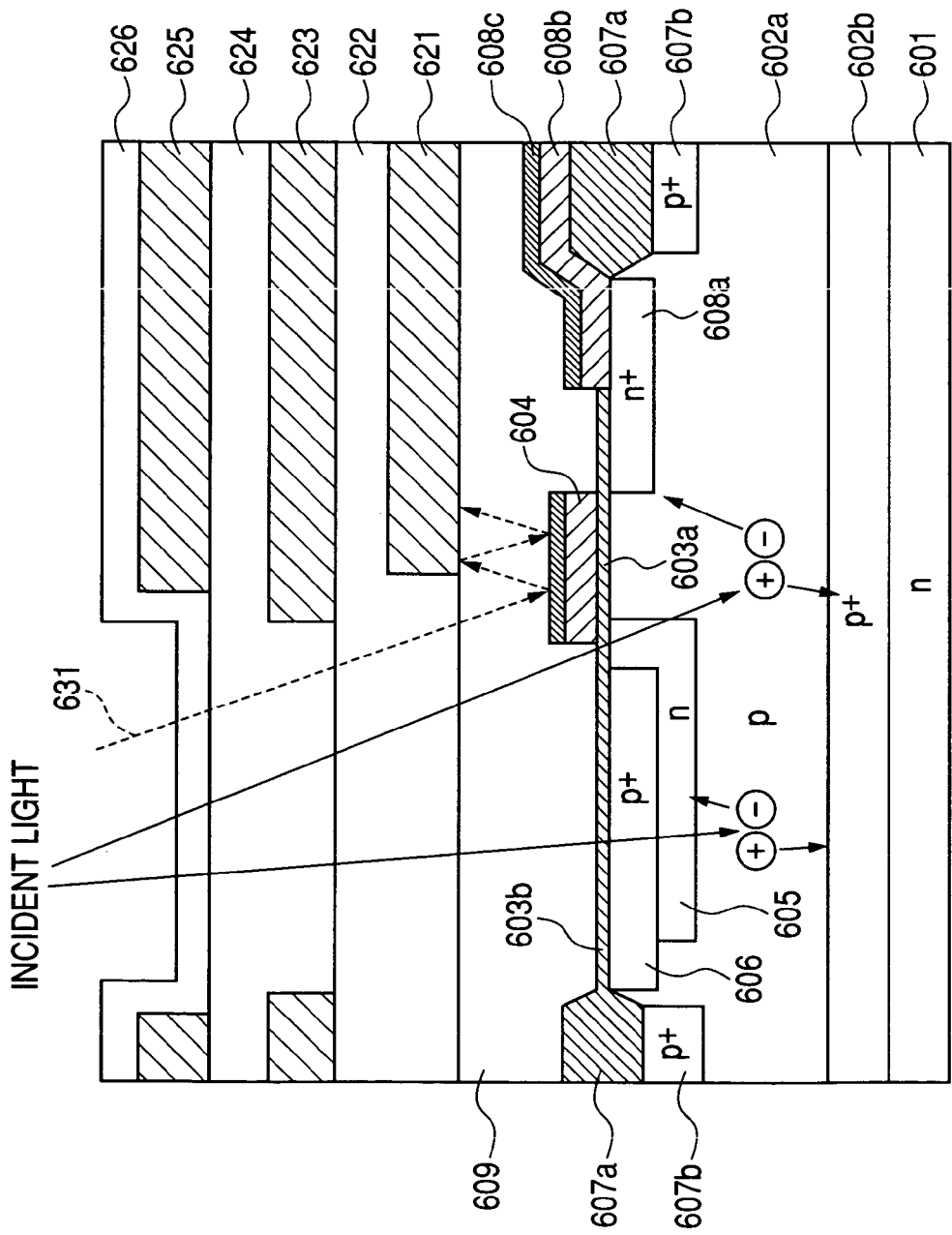
FIG. 6 is a sectional view of a CMOS solid-state image pick-up device of a second embodiment according to the present invention.

FIG. 6 is a sectional view of a pixel section of a solid-state image pick-up device of a second embodiment according to the present invention. Reference numeral 601 denotes an n-type silicon substrate, 602a denoting a P-type well, 602b denoting a P-type embedded layer, 603a denoting a gate oxide film of a MOS transistor, 603b denoting a thin oxide film on a light receiving section, 604 denoting a gate electrode of a transfer MOS transistor, 605 denoting an N-type cathode of the photodiode 1, 606 denoting a surface P-type region for making the photodiode formed into an embedded structure, 607a denoting a LOCOS oxide film for element isolation, 607b denoting a P-type channel stop layer, and 608a denoting an N-type high concentration region which forms a floating diffusion and which is also formed to be a drain region of the transfer MOS transistor. Reference character 608b denotes a polysilicon lead-out electrode brought into direct contact with the N-type high concentration region. The top surface of the polysilicon lead-out electrode 608b is formed of a metal. Reference character 608c denotes, for example, a silicide formed of Ti, W, or Mo. Also, reference numeral 609 denotes silicon oxide film insulating the gate electrode from a metal first layer, 621 denoting the metal first layer shading the floating diffusion section. Reference numeral 622 denotes an interlayer insulating film insulating the metal first layer from a metal second layer, 623 denoting the metal second layer, 624 denoting an interlayer insulting film insulating the metal second layer from a metal third layer, 625 denoting the metal third layer and 626 denoting a passivation film.

According to the present embodiment, light entering into the floating diffusion is further reduced by making the top surface of the polysilicon electrode low in reflection to the visible light. That is, among incident lights, the light incident on the gate electrode 604 of the transfer MOS transistor is not transmitted, so that light directly entering into the silicon is reduced. In addition, the intensity of the reflected light can also be reduced by suppressing the reflectance of the silicide 608c low. Since the top surface of the polysilicon direct contact 608b is also covered by silicide, even when there is a stray light, components of the light directly passing through the polysilicon can be made small.

Third Embodiment

Figure 7:
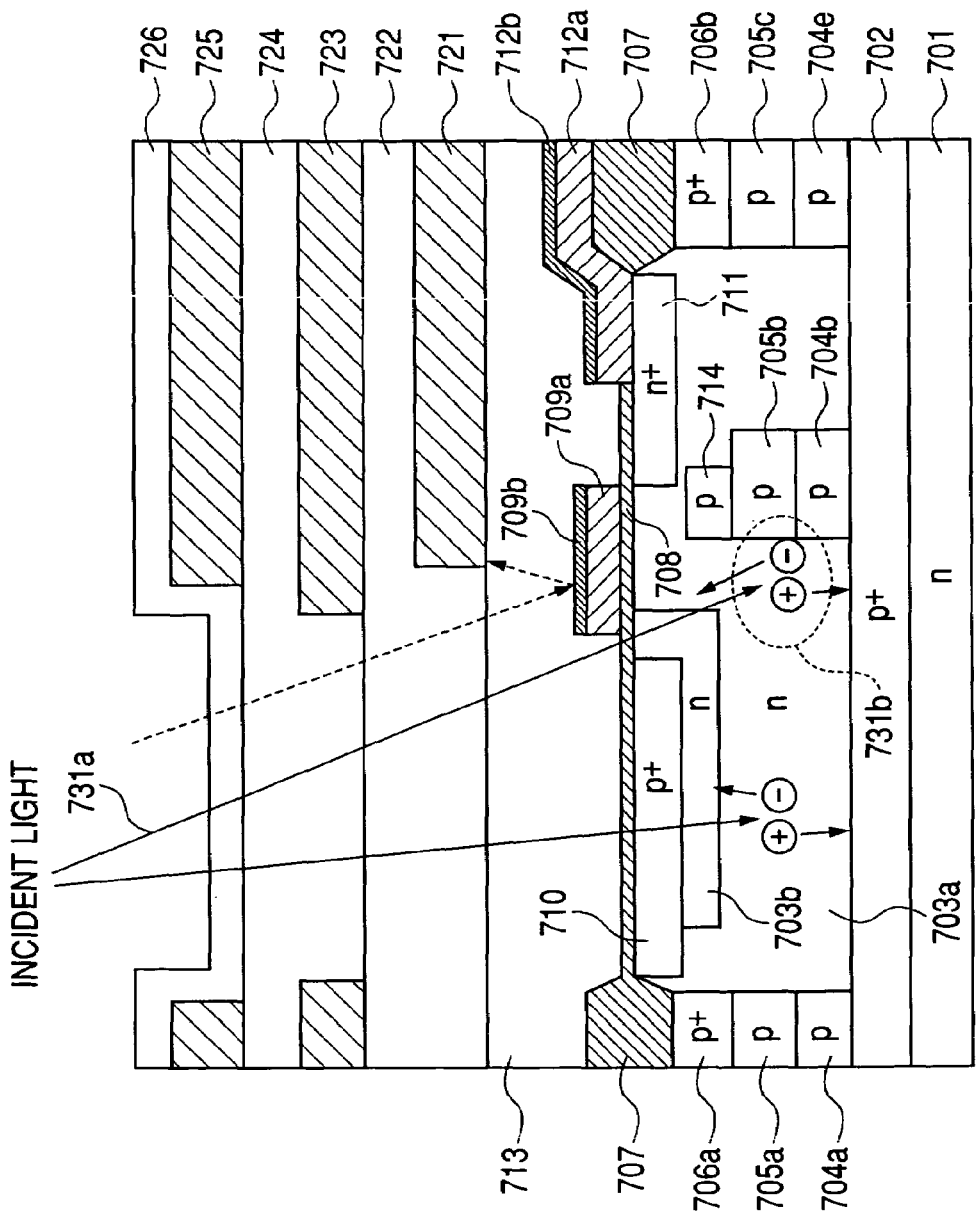
FIG. 7 is a sectional view of a CMOS solid-state image pick up device of a third embodiment according to the present invention.

FIG. 7 is a sectional view of a pixel section of a solid-state image pick-up device of a third embodiment according to the present invention. Reference numeral 701 denotes an N type silicon substrate, 702 denoting a embedded P-type high concentration layer, 703a denoting an N-type epitaxial layer, 703b denoting an N-type cathode of a photodiode, 704a, 704b, 704c denoting P-type isolation layers, and 705a, 705b, 705c denoting P-type well layers. Reference characters 706a, 706b denote channel stop P-type layers below a field oxide film. Reference numeral 714 denotes a field stop layer defining a charge transfer path to a floating diffusion to form a potential barrier directly under a transfer MOS transistor, 707 denoting the field oxide film, 708 denoting a gate oxide film of a MOS transistor, 709a denoting a gate polysilicon of the transfer MOS transistor, on which surface a metal silicide layer 709b is provided and 710 denoting a surface P-type layer for forming the photodiode into a embedded type. Reference numeral 711 denotes an N-type high concentration diffusion region of the transfer MOS transistor. Reference character 712a denotes a polysilicon lead-out electrode brought into direct contact with the N-type high concentration region. The top surface of the polysilicon lead-out electrode 712b is formed of a metal silicide. Reference numeral 713 also denotes a silicon oxide film insulating the gate electrode from a metal first layer, 721 denoting the metal first layer shading the floating diffusion section. Reference numeral 722 denotes an interlayer insulating film insulating the metal first layer from a metal second layer, 723 denoting the metal second layer, 724 denoting an interlayer insulating film insulating the metal second layer from a metal third layer, 725 denoting the metal third layer, and 726 denoting a passivation film.

In the present embodiment as in the second embodiment, the aliasing incident from the top surface on the floating diffusion is reduced by forming the uppermost layer of the polysilicon gate into a metal silicide film, and at the same time, electrons of electron-hole pairs 731b generated at the end of the photodiode by obliquely incident light 731a, are collected to the cathode 703 of the photodiode by P-type isolation layer 704b, P-type well layer 705b and the field stop layer 714, without diffusing into the floating diffusion side.

In this way, according to the present embodiment, it is possible to suppress the diffusion from the inside of the silicon into the floating diffusion. The combination of the silicide and the potential barrier makes it possible to eliminate the aliasing more effectively.

This application claims priority from Japanese Patent Application No. 2004-042939 filed on Feb. 19, 2004, which is hereby incorporated by reference herein.

What is claimed is:

1. A solid-state image pick-up device having a photoelectric conversion section, a signal amplifying section, and a floating diffusion for said photoelectric conversion section serving as an input for said signal amplifying section,
    wherein at least a part of a connection path from said floating diffusion to said signal amplifying section is formed through a direct contact of said floating diffusion with a polysilicon, and said floating diffusion is shaded by a metal layer which is closest to said floating diffusion but is not electrically connected with said floating diffusion, and
    wherein said metal layer closest to the floating diffusion has a reflectance lower than the reflectance of other layers of metal.

2. The solid-state image pick-up device according to claim 1, which has a plurality of pixels, each comprising the photoelectric conversion section, the signal amplifying section, the floating diffusion, reset means and charge transfer means and, wherein, after all pixels are reset at the same time, a signal charge stored in said photoelectric conversion section in each pixel is simultaneously transferred to the floating diffusion, so as to make a potential of said floating diffusion read out sequentially.

3. An imaging system comprising:

an image forming optical system for forming an image of light from a subject;

a solid-state image pick-up device according to claim 1, for performing photoelectric conversion of the formed image; and a signal processing circuit for performing digital conversion and processing of an output signal from said solid-state image pick-up device.

* * * * *

UNITED STATES PATENT AND TRADEMARK OFFICE
CERTIFICATE OF CORRECTION

| | |
|---|---|
| PATENT NO. | : 7,307,300 B2 |
| APPLICATION NO. | : 11/054316 |
| DATED | : December 11, 2007 |
| INVENTOR(S) | : Shunsuke Inoue |

It is certified that error appears in the above-identified patent and that said Letters Patent is hereby corrected as shown below:

TITLE PAGE, ITEM [57] ABSTRACT

Line 16, "repeats" should read --repeat--.
Line 17, "sufficienly" should read --sufficiently--.

COLUMN 1

Line 26, "above described" should read --above-described--.

COLUMN 2

Line 53, "above described" should read --above-described--.
Line 55, "is" should read --are--.

COLUMN 3

Line 1, "first layer metal 320" should read --metal first layer 321--.
Line 14, "solid state" should read --solid-state--.
Line 48, "above described" should read --above-described--.

COLUMN 4

Line 35, "a" should read --an--.
Line 42, "or" should read --of--.

COLUMN 5

Line 31, "lower most" should read --lowermost--.
Line 43, "after" should read --after being--.

UNITED STATES PATENT AND TRADEMARK OFFICE
CERTIFICATE OF CORRECTION

| | | |
|---|---|---|
| PATENT NO. | : 7,307,300 B2 | Page 2 of 2 |
| APPLICATION NO. | : 11/054316 | |
| DATED | : December 11, 2007 | |
| INVENTOR(S) | : Shunsuke Inoue | |

It is certified that error appears in the above-identified patent and that said Letters Patent is hereby corrected as shown below:

<u>COLUMN 10</u>

Line 19, "an" should read --an--.

Signed and Sealed this

Eighth Day of July, 2008

JON W. DUDAS
*Director of the United States Patent and Trademark Office*